United States Patent
Hurley et al.

(10) Patent No.: US 6,674,145 B2
(45) Date of Patent: Jan. 6, 2004

(54) FLASH MEMORY CIRCUITRY

(75) Inventors: Kelly T. Hurley, Boise, ID (US); Graham Wolstenholme, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/377,064

(22) Filed: Feb. 28, 2003

(65) Prior Publication Data

US 2003/0151080 A1 Aug. 14, 2003

Related U.S. Application Data

(62) Division of application No. 10/261,830, filed on Sep. 30, 2002, which is a division of application No. 09/650,711, filed on Aug. 29, 2000.

(51) Int. Cl.[7] .............................................. H01L 29/00
(52) U.S. Cl. ....................... 257/506; 257/268; 257/296; 257/499; 257/505; 257/701
(58) Field of Search ................................ 257/701, 268, 257/296, 499, 505, 506; 438/211

(56) References Cited

U.S. PATENT DOCUMENTS

| | | |
|---|---|---|
| 4,698,900 A | 10/1987 | Esquivel |
| 5,153,143 A | 10/1992 | Schlais et al. ............... 437/43 |
| 5,270,240 A | 12/1993 | Lee |
| 5,376,572 A | 12/1994 | Yang et al. .................... 437/43 |
| 5,384,280 A | 1/1995 | Aoki et al. .................... 438/425 |
| 5,424,233 A | 6/1995 | Yang et al. .................... 437/43 |
| 5,498,558 A | 3/1996 | Kapoor ........................ 437/43 |
| 5,512,504 A | 4/1996 | Wolstenholme .............. 437/43 |
| 5,552,331 A | 9/1996 | Hsu et al. |
| 5,605,853 A | 2/1997 | Yoo et al. ..................... 437/43 |
| 5,679,591 A | 10/1997 | Lin et al. |
| 5,691,246 A | 11/1997 | Becker et al. ............... 437/225 |
| 5,854,108 A | 12/1998 | Hsu et al. .................... 438/257 |
| 5,960,276 A | 9/1999 | Liaw et al. .................. 438/224 |
| 5,976,927 A | 11/1999 | Hsieh et al. ................. 438/239 |
| 5,987,573 A | 11/1999 | Hiraka ........................ 711/156 |
| 5,998,301 A | 12/1999 | Pham et al. ................. 438/701 |
| 6,020,229 A | 2/2000 | Yamane et al. ............. 438/201 |

(List continued on next page.)

Primary Examiner—Michael S. Lebentritt
Assistant Examiner—Douglas Menz
(74) Attorney, Agent, or Firm—Wells St. John P.S.

(57) ABSTRACT

A method of forming FLASH memory circuitry having an array of memory cells and having FLASH memory peripheral circuitry operatively configured to at least read from the memory cells of the array, includes forming a plurality of spaced isolation trenches within a semiconductor substrate within a FLASH memory array area and within a FLASH, peripheral circuitry area peripheral to the memory array area. The forming includes forming at least some of the isolation trenches within the FLASH memory array to have maximum depths which are different within the substrate than that of at least some of the isolation trenches within the FLASH peripheral circuitry area. A method of forming FLASH memory circuitry having an array of memory cells and having FLASH memory peripheral circuitry operatively configured to at least read from the memory cells of the array, includes forming a plurality of spaced isolation trenches within a semiconductor substrate within a FLASH memory array area and within a FLASH peripheral circuitry area peripheral to the memory array area. The forming includes forming at least some of the isolation trenches within the FLASH memory array to have sidewalls which are angled differently relative to the semiconductor substrate than sidewalls of at least some of the isolation trenches of the FLASH peripheral circuitry area. FLASH memory circuitry independent of the method for forming is also disclosed.

6 Claims, 11 Drawing Sheets

U.S. PATENT DOCUMENTS

| | | | |
|---|---|---|---|
| 6,037,221 A | 3/2000 | Lee et al. ................... 438/257 |
| 6,037,223 A | 3/2000 | Su et al. |
| 6,043,123 A | 3/2000 | Wang et al. ................ 438/258 |
| 6,074,915 A | 6/2000 | Chen et al. ................ 438/258 |
| 6,074,959 A | 6/2000 | Wang et al. ................ 438/738 |
| 6,080,624 A | 6/2000 | Kamiya ..................... 438/257 |
| 6,096,603 A | 8/2000 | Chang et al. .............. 438/258 |
| 6,103,574 A | 8/2000 | Iwasaki |
| 6,149,828 A | 11/2000 | Vaatstra ...................... 216/57 |
| 6,197,639 B1 | 3/2001 | Lee et al. ................... 438/258 |
| 6,232,181 B1 | 5/2001 | Lee ........................... 438/257 |
| 6,235,581 B1 | 5/2001 | Chen ......................... 438/257 |
| 6,235,582 B1 | 5/2001 | Chen ......................... 438/257 |
| 6,238,976 B1 | 5/2001 | Noble ........................ 438/257 |
| 6,245,639 B1 | 6/2001 | Tsai et al. |
| 6,258,665 B1 | 7/2001 | Shimizu ..................... 438/211 |
| 6,265,292 B1 | 7/2001 | Parat et al. ................. 438/524 |
| 6,277,693 B1 | 8/2001 | Chen |
| 6,306,737 B1 | 10/2001 | Mehrad et al. |
| 6,337,244 B1 | 1/2002 | Prall .......................... 438/257 |
| 6,406,959 B2 | 6/2002 | Prall .......................... 438/258 |
| 6,436,751 B1 | 8/2002 | Liou et al. .................. 438/211 |
| 2002/0039821 A1 | 4/2002 | Wolstenholme |
| 2003/0027390 A1 | 2/2003 | Wolstenholme |
| 2003/0064563 A1 | 4/2003 | Wolstenholme |

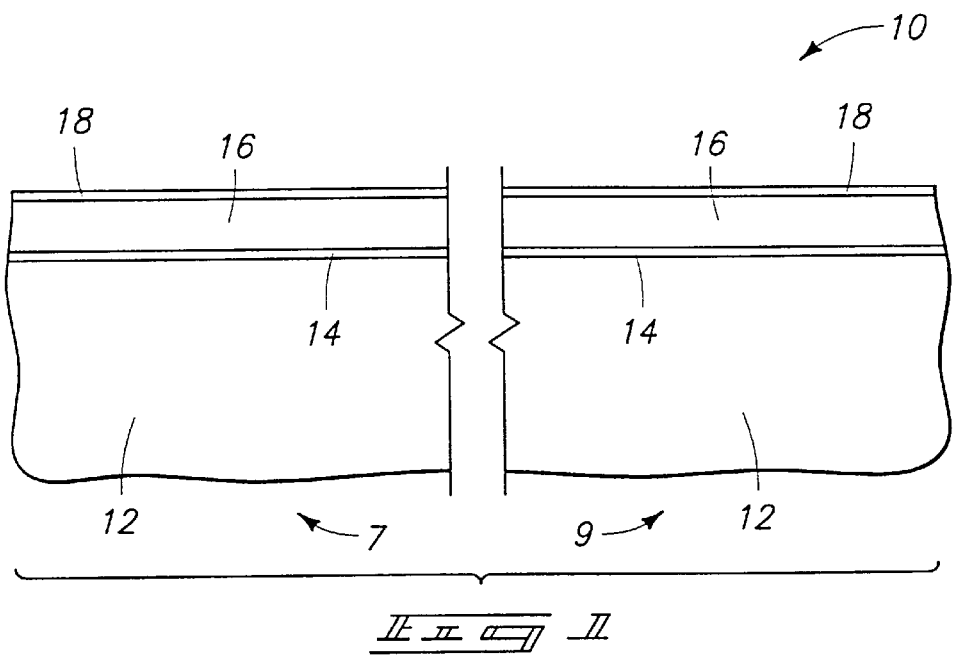
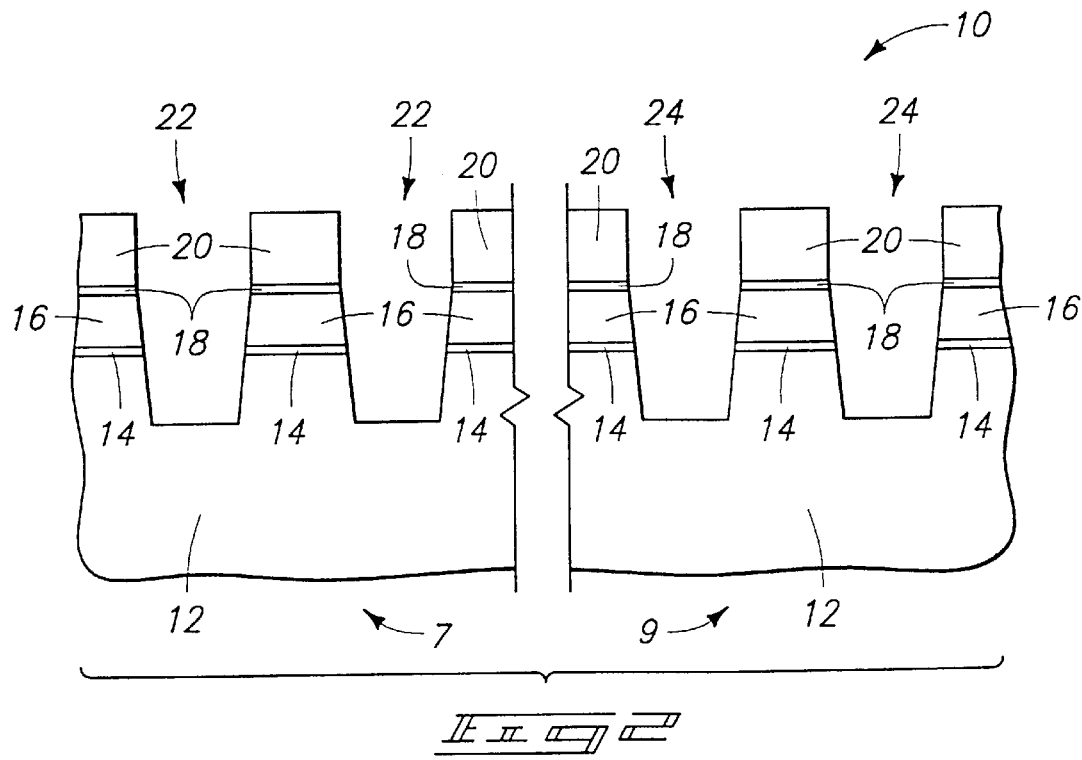

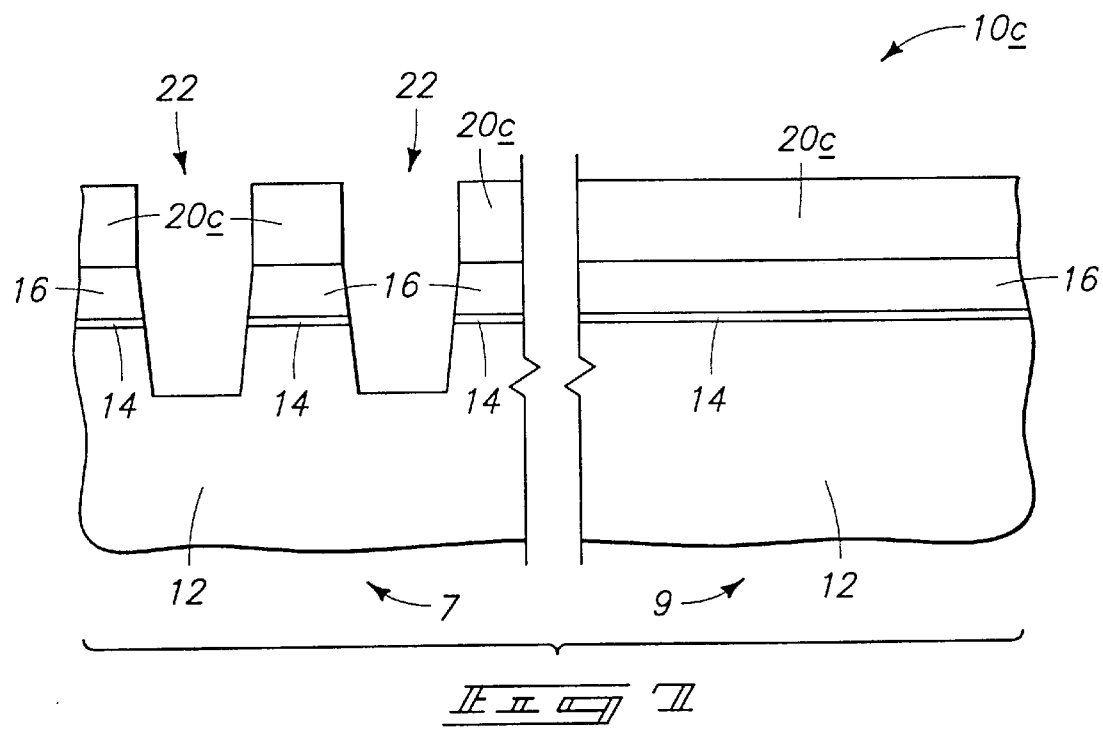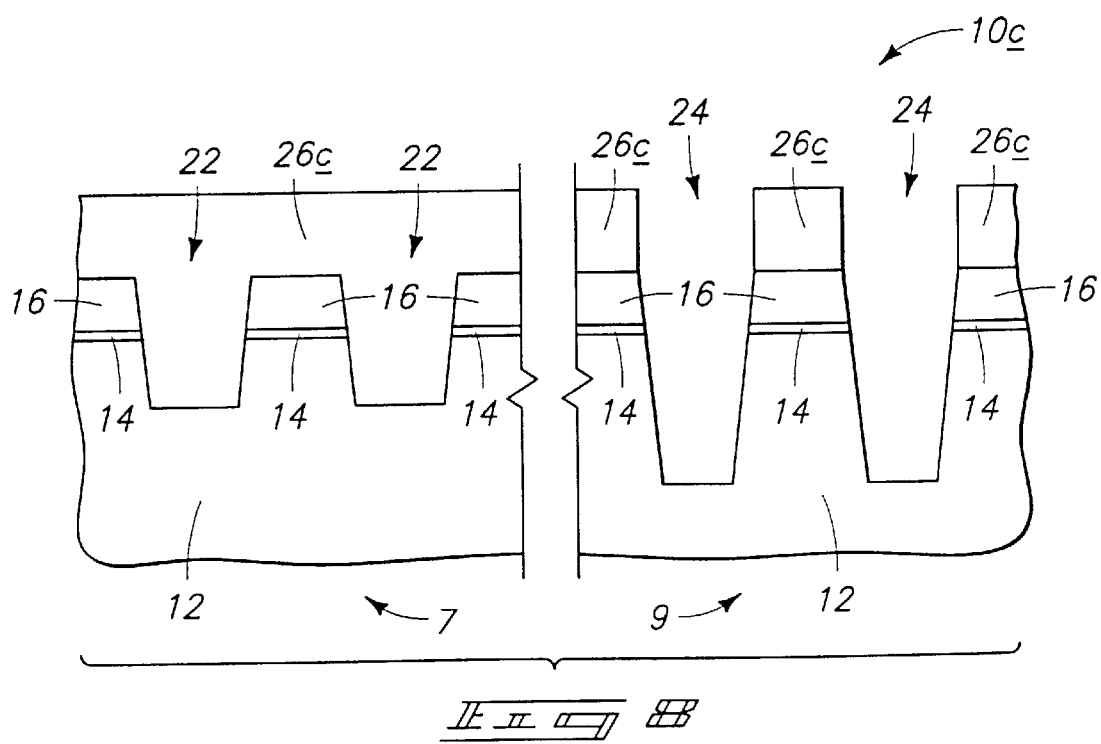

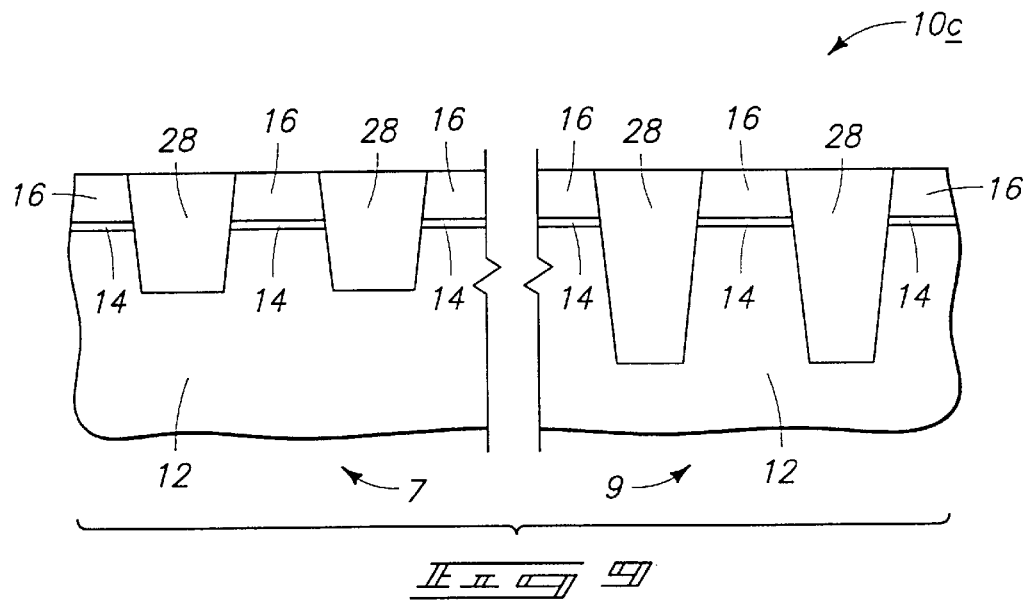
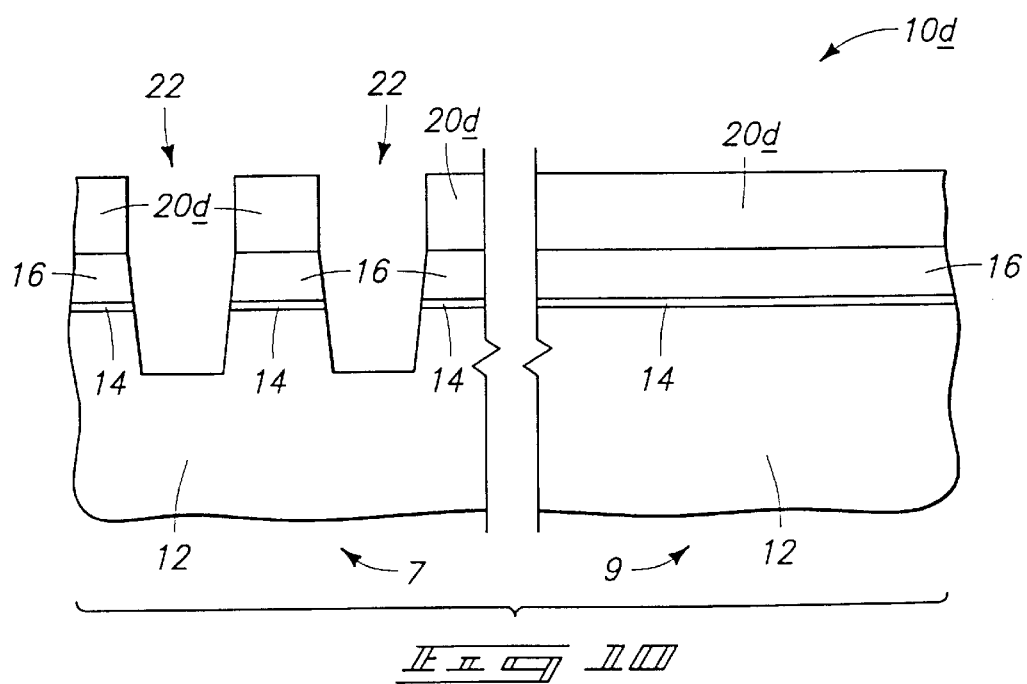

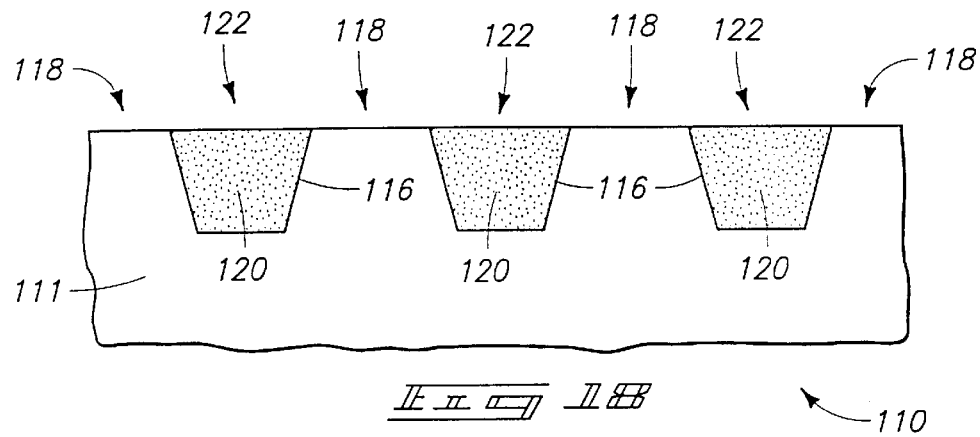
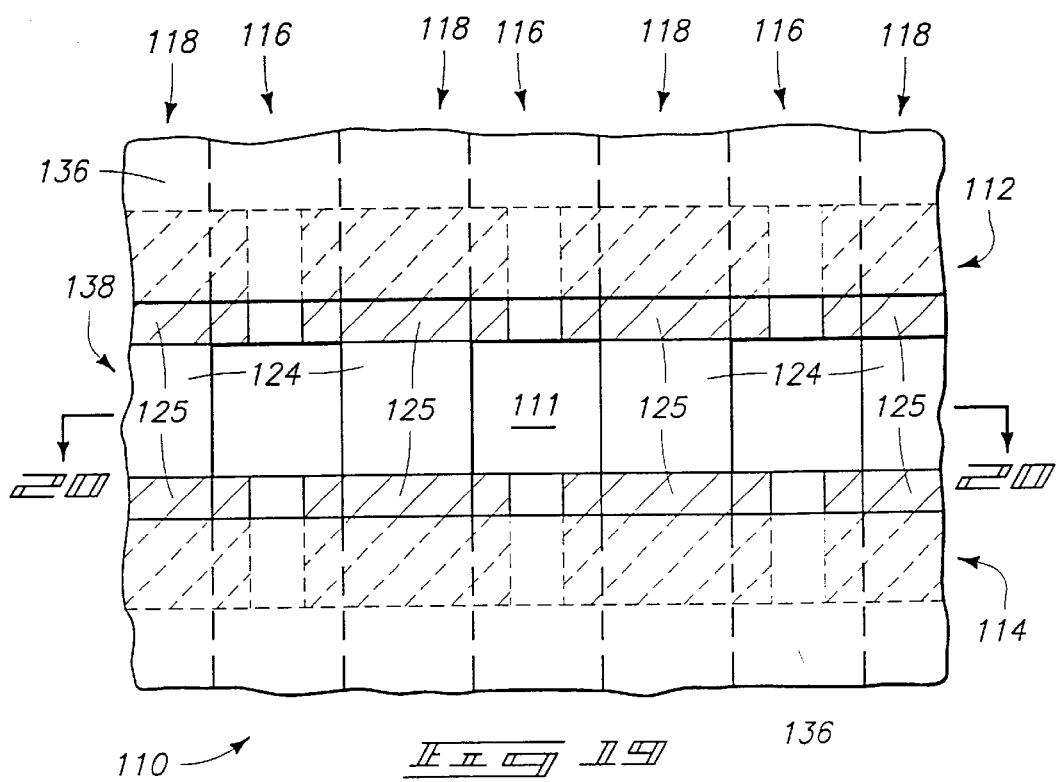

FLASH MEMORY CIRCUITRY

RELATED PATENT DATA

This patent resulted from a divisional application of U.S. patent application Ser. No. 10/261,830, filed Sep. 30, 2002, entitled "FLASH Memory Circuitry", naming Kelly T. Hurley and Graham Wolstenholme as inventors, the disclosure of which is incorporated herein; which patent application was a divisional application of U.S. patent application Ser. No. 09/650,711, filed Aug. 29, 2000, entitled "Method of Forming FLASH Memory", naming Kelly T. Hurley and Graham Wolstenholme as inventors, the disclosure of which is incorporated by reference.

TECHNICAL FIELD

This invention relates generally to FLASH memory and to methods of forming FLASH memory.

BACKGROUND OF THE INVENTION

Memory is but one type of integrated circuitry. Some memory circuitry allows for both on-demand data storage and data retrieval. For example, memories which allow both writing and reading, and whose memory cells can be accessed in a random order independent of physical location, are referred to as random-access memories (RAM). Read-only memories (ROMs) are those in which only the read operation can be performed rapidly. Entering data into a read-only memory is typically referred to as programming, and the operation is considerably slower than the writing operation utilized in random-access memory. With random-access memory, information is typically stored with respect to each memory cell either through charging of a capacitor or the setting of a state of a bi-stable flip-flop circuit. With either, the stored information is destroyed when power is interrupted. Read-only memories are typically non-volatile, with the data being entered during manufacturing or subsequently during programming.

Some read-only memory devices can be erased as well as written to by a programmer. Erasable read-only memory typically depends on the long-term retention of electronic charge as the information storage mechanism. The charge is typically stored on a floating semiconductive gate, such as polysilicon. One type of read-only memory comprises FLASH memory. Such memory can be selectively erased rapidly through the use of an electrical erase signal.

A FLASH memory cell typically comprises a single floating gate transistor. For multiple storage cells, such as used in large semiconductor memories, the storage cells of the memory are arranged in an array consisting of rows and columns. The rows are typically considered as comprising individual conductive gate lines formed as a series of spaced floating gates received along a single conductive line (hereafter referred to as "a line of floating gates"). Source and drain regions of the cells are formed relative to active area of a semiconductor substrate, with the active areas being generally formed in lines running substantially perpendicular to the lines of floating gates. The sources and drains are formed on opposing sides of the lines of floating gates within the active area with respect to each floating gate of the array. Thus, lines (rows) of programmable transistors are formed.

Electrical connections are made with respect to each drain to enable separate accessing of each memory cell. Such interconnections are arranged in lines comprising the columns of the array. The sources in FLASH memory, however, are typically all interconnected and provided at one potential, for example ground, throughout the array. Accordingly, the source regions along a given line of floating gates are typically all provided to interconnect within the substrate in a line running parallel and immediately adjacent the line of floating gates. These regions of continuously running source area are interconnected outside of the array, and strapped to a suitable connection for providing the desired potential relative to all the sources within the array. Accordingly, prior art techniques have been utilized to form a line of continuously running implanted source material within the semiconductor substrate and running parallel with the floating gate word lines.

In a principal technique of achieving the same, the substrate has first been fabricated to form field oxide regions by LOCOS. The fabrication forms alternating strips of active area and LOCOS field oxide running substantially perpendicular to the floating gate word lines which will be subsequently formed. Thus running immediately adjacent and parallel with the respective word lines will be an alternating series of LOCOS isolation regions and active area regions on both the source and drain sides of a respective line of floating gates. After forming the lines of floating gates and to provide a continuous line of essentially interconnected source regions, the substrate is masked to form an exposed area on the source side of the respective lines of floating gates. The LOCOS oxide is then selectively etched relative to the underlying substrate. This leaves a series of spaced trenches along the lines of floating gates the result of removal of oxide from the previously oxidized substrate which formed the LOCOS regions.

Non-recessed LOCOS in fabrication of FLASH memory in this manner is typically very shallow relative to the semiconductor substrate (i.e., less than 1500 Angstroms deep). This leaves a gradual, almost sinusoidal, undulating surface of exposed semiconductor substrate running in lines substantially parallel and immediately adjacent the lines of floating gates on the desired source side. With the gently sloping sidewalls of the trenches or recesses left by the LOCOS oxide removal, one or more source ion implant steps are conducted through the mask openings of the remaining photoresist layer. The result is formation of a continuously and conductively doped source line within the semiconductor substrate immediately adjacent the line of floating gates. Circuitry fabrication and isolation of adjacent circuitry within a semiconductor substrate can also be achieved with a trench isolation that is different from LOCOS. For example, trenches can initially be etched within a semiconductor substrate and subsequently filled with an insulating material, such as high density plasma deposited oxide. Such trenches can and are sometimes made considerably deeper relative to the outer substrate surface as compared to the oxidation depth of LOCOS. Accordingly, the etching typically produces elongated, deeper and straighter sidewalls than LOCOS. Further, the FLASH memory circuitry includes both an array of the FLASH memory cells and peripheral circuitry outside of the array for accessing data within the array. The isolation requirements of the periphery are typically greater than that of the array, meaning the trench depth across the substrate has historically been optimized for the periphery to achieve adequate isolation. Unfortunately, this leads to increased array source line resistance. This is due to the effectively longer source line which is formed. Further, the elongation results from longer trench sidewalls where resistance is typically greatest due to typical shallower source implant there versus the bases and substrate area between trenches.

SUMMARY

The invention includes FLASH memory and methods of forming FLASH memory. In one implementation, a method of forming FLASH memory circuitry having an array of memory cells and having FLASH memory peripheral circuitry operatively configured to at least read from the memory cells of the array, includes forming a plurality of spaced isolation trenches within a semiconductor substrate within a FLASH memory array area and within a FLASH peripheral circuitry area peripheral to the memory array area. The forming includes forming at least some of the isolation trenches within the FLASH memory array to have maximum depths which are different within the substrate than at least some of the isolation trenches within the FLASH peripheral circuitry area.

In one implementation, a method of forming FLASH memory circuitry having an array of memory cells and having FLASH memory peripheral circuitry operatively configured to at least read from the memory cells of the array, includes forming a plurality of spaced isolation trenches within a semiconductor substrate within a FLASH memory array area and within a FLASH peripheral circuitry area peripheral to the memory array area. The forming includes forming at least some of the isolation trenches within the FLASH memory array to have sidewalls which are angled differently relative to the semiconductor substrate than sidewalls of at least some of the isolation trenches of the FLASH peripheral circuitry area.

In one implementation, FLASH memory circuitry includes a semiconductor substrate having a FLASH memory array area and having FLASH peripheral circuitry area having circuitry configured to at least read information from the FLASH memory array area. A first line of floating gates having opposing sides is received over the semiconductor substrate at least within the FLASH memory array area. An alternating series of trench isolation regions and active area regions are in the semiconductor substrate within the FLASH memory array area formed in a second line along one side of at least a portion of the first line of floating gates. The series of second line active area regions are conductively doped with a conductivity enhancing impurity and separated by the first line trench isolation regions along the second line. The second line trench isolation regions have a first maximum depth within the semiconductor substrate. A series of spaced trenches are within the semiconductor substrate within the FLASH memory array area formed in a third line along the other side of at least a portion of the first line of floating gates. The third line spaced trenches and semiconductor substrate material therebetween are conductively doped with a conductivity enhancing impurity along at least a portion of the third line to form a continuous line of source active area within the semiconductor substrate along at least a portion of the first line of floating gates along the other side. The third line trenches have a second maximum depth within the semiconductor substrate. A series of spaced trench isolation regions are formed in the semiconductor substrate within the FLASH peripheral circuitry area. At least some of the FLASH peripheral circuitry area spaced trench isolation regions have maximum depths which are different from the first and second maximum depths.

Other implementations are disclosed and contemplated.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at a processing step in accordance with an aspect of the invention.

FIG. 2 is a view of the FIG. 1 wafer fragment at a processing step subsequent to that depicted by FIG. 1.

FIG. 7 is a view of the FIG. 6 wafer fragment at a processing step subsequent to that depicted by FIG. 6.

FIG. 8 is a view of the FIG. 6 wafer fragment at a processing step subsequent to that depicted by FIG. 7.

FIG. 9 is a view of the FIG. 6 wafer fragment at a processing step subsequent to that depicted by FIG. 8.

FIG. 10 is a diagrammatic sectional view of another alternate embodiment semiconductor wafer fragment at a processing step in accordance with another alternate aspect of the invention.

FIG. 18 is a sectional view taken through line 18—18 in FIG. 15.

FIG. 19 is a top plan view of the FIG. 15 fragment at a processing step subsequent to that of FIG. 15.

DETAILED DESCRIPTION OF THE PREFERRED EMBODIMENTS

Figure 3:
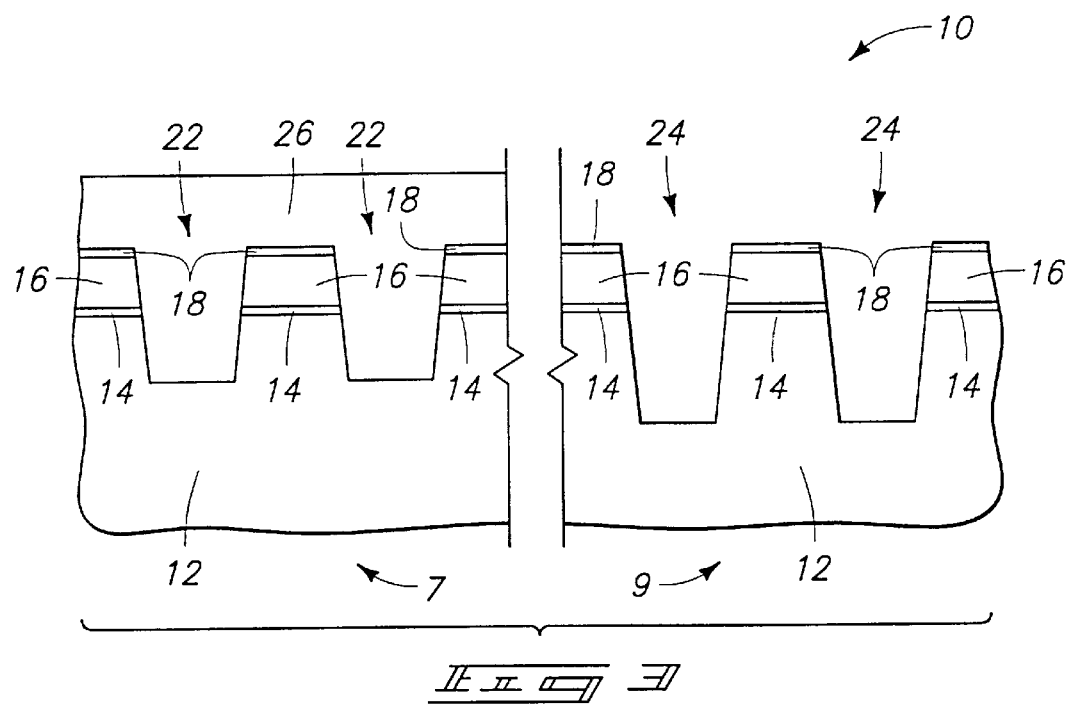
FIG. 3 is a view of the FIG. 1 wafer fragment at a processing step subsequent to that depicted by FIG. 2.

This disclosure of the invention is submitted in furtherance of the constitutional purposes of the U.S. Patent Laws "to promote the progress of science and useful arts" (Article 1, Section 8).

Referring initially to FIG. 1, a semiconductor wafer in process is indicated generally with reference to numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural.

Substrate 10 comprises a bulk monocrystalline silicon substrate 12. A first oxide comprising layer 14 is formed over semiconductor substrate 12. An example material is undoped silicon dioxide grown to a thickness range from about 50 Angstroms to about 200 Angstroms. A silicon nitride comprising layer 16 is formed over silicon oxide comprising layer 14. An example thickness for layer 16 from about 500 Angstroms to about 1500 Angstroms, with layer 16 preferably consisting essentially of silicon nitride. A second oxide comprising layer 18 is formed over silicon nitride comprising layer 16. An example preferred material is undoped silicon dioxide deposited to an exemplary thickness of from about 100 Angstroms to about 3000 Angstroms. FIG. 1 depicts two areas or regions 7 and 9. Area or region 7 will be fabricated to comprise an array of FLASH memory cells. Area or region 9 will comprise FLASH memory peripheral circuitry operatively configured to at least read from the memory cells of the array.

Referring to FIG. 2, a first layer of resist, preferably photoresist, is deposited and patterned to form outlines of FLASH memory array isolation trenches 22 within FLASH memory array area 7 and spaced isolation trench outlines 24 within FLASH memory peripheral circuitry area 9. First etching is conducted as shown through layers 18, 16 and 14 and into substrate 12. Such provides but one example of conducting in a common first resist masking step, patterning a first layer of resist and first etching a plurality of spaced isolation trenches into a semiconductor substrate within a FLASH memory array area and within a FLASH peripheral circuitry area. An exemplary depth for trenches 22 and 24 in this stage of the process is from about 1000 Angstroms to about 4000 Angstroms. Trenches 22 and 24 preferably have sidewalls normal or within 10° to 15° degrees of normal to the general substrate orientation.

Referring to FIG. 3, first layer of resist 20 has been removed and a second layer of resist 26, preferably photoresist, has been patterned over second oxide comprising layer 18 to second mask at least some of isolation trenches 22 within FLASH memory array area 7. Second etching is then conducted of at least some of isolation trenches 24 within FLASH peripheral circuitry area 9 to produce maximum; depths thereof which are deeper within semiconductor substrate 12 than isolation trenches 22 within FLASH memory array area 7. Most preferably, all isolation trenches 22 within FLASH memory array area 7 are fabricated to have maximum depths which are shallower within substrate 12 than all isolation trenches 24 within FLASH peripheral area 9. Accordingly, second masking material 26 preferably masks all isolation trenches 22 within FLASH memory array area 7 during the etching to deepen trenches 24. Layer 18 preferably functions as an etch stop during the etch which deepens trenches 24.

Such provides but one example of producing FLASH memory array and peripheral circuitry isolation trenches where at least some of the isolation trenches within the FLASH memory array have maximum depths which are shallower within the substrate than at least some of the isolation trenches within the FLASH peripheral circuitry area. As will be apparent from the continuing discussion, in the preferred embodiments, such enables and provides deeper trench isolation within the FLASH peripheral circuitry area than in the FLASH memory array area, and as well effectively can reduce the resistance of the source lines of the FLASH memory array area by effectively shortening their lengths. The invention was primarily motivated and reduced to practice in achieving these objectives, although the invention is not so limited. For example, the invention contemplates forming at least some isolation trenches within a FLASH memory array to have maximum depths which are different within the substrate than that of at least some of the isolation trenches within the FLASH peripheral circuitry area. For example, the illustrated and preferred embodiment illustrates the isolation trenches of the peripheral circuitry area being deeper than that of the array. This could of course be reversed. Preferably as shown and described, the processing comprises photolithography and chemical etching. Trench depth in the respective etches is preferably controlled by the time of the etch.

Figure 4:
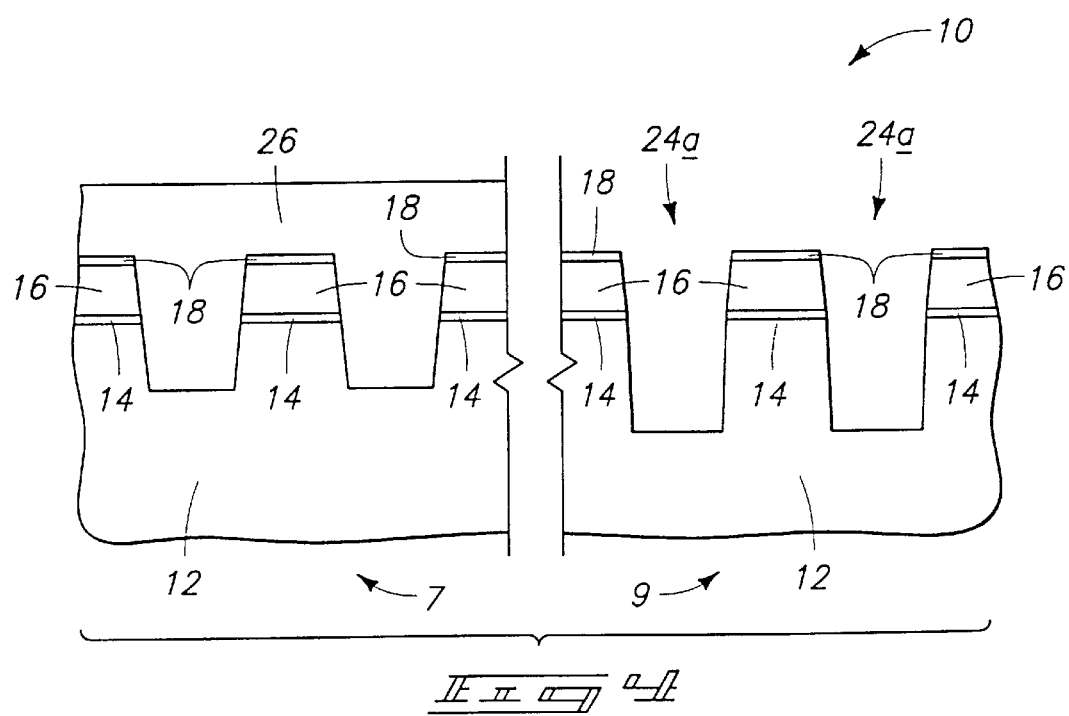
FIG. 4 is a view of the FIG. 1 wafer fragment at a processing step subsequent to that depicted by FIG. 2, and is an alternate embodiment to that of FIG. 3.

An alternate embodiment is described with reference to FIG. 4. Like numerals from the first described embodiment are utilized where appropriate, with differences being indicated with the suffix "a". FIG. 2 depicted trenches 22 and 24 as having been first etched to have sidewalls which are angled at some suitable angle from the general orientation or outer surface of the semiconductor substrate, the same as in FIG. 2. FIG. 3 illustrated continuing the etching of isolation trenches 24 in a manner which continues the same essential sidewall angling for trenches 24 that occurred from the first etch. FIG. 4 illustrates exemplary alternate processing whereby trench openings 24a are produced to have inner sidewalls which are angled from the semiconductor substrate differently than the trench sidewalls produced by the first etching. Accordingly, an example is presented where the sidewall angling of FLASH memory array trenches 22 and that of FLASH peripheral circuitry isolation trenches 24a are different from one another. Such variable sidewall angling can be controlled as known by people of skill in the art by varying chemistry and other etching conditions. The exemplary illustrated etching which extends FLASH peripheral circuitry area isolation trenches 24a in FIG. 4 is shown as forming the inner sidewalls to be angled less from orthogonal to the substrate than the sidewalls produced by the first etching. This might be desired to increase the degree of isolation in the periphery versus the array.

Figure 14:
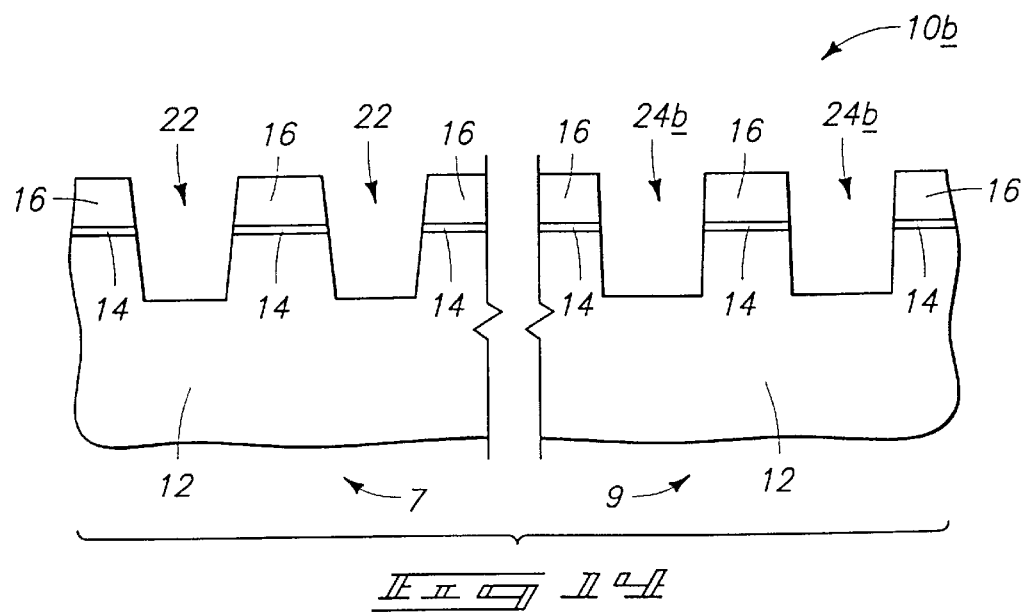
FIG. 14 is a diagrammatic sectional view of still another alternate embodiment semiconductor wafer fragment at a processing step in accordance with still another alternate aspect of the invention.

The invention also contemplates variable sidewall angling between FLASH memory array isolation trenches and FLASH peripheral circuitry isolation trenches independent of depth or other differences. For example, FIG. 14 illustrates another alternate embodiment fragment 10b. Like numerals from the first described embodiment are utilized where appropriate, with differences being indicated by the suffix "b". FLASH memory array isolation trenches 22 and FLASH memory peripheral circuitry isolation trenches 24b are shown to have the same ultimate trench depth, yet different sidewall angling. In the illustrated and preferred embodiment, both such trench sidewalls are shown to be angled from orthogonal to the substrate, with the sidewalls of array trenches 22 being angled greater from orthogonal to the substrate than sidewalls of isolation trenches 24b within FLASH memory peripheral circuitry area 9. Further, the fabrication to produce FIG. 14 might be conducted in a common masking step or in two or more separate masking steps.

Figure 5:
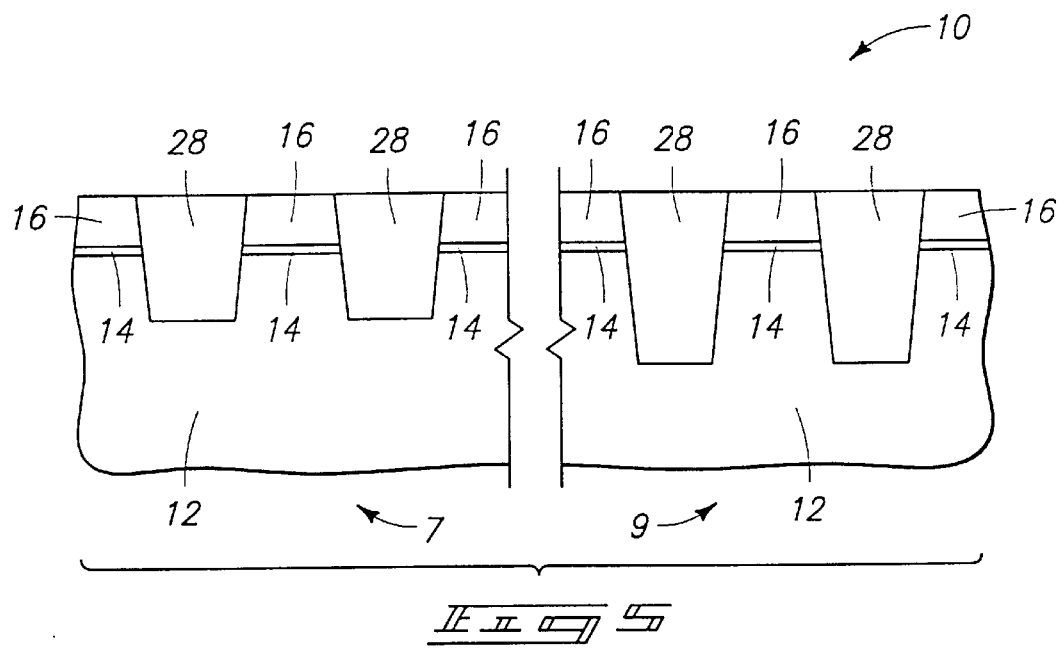
FIG. 5 is a view of the FIG. 1 wafer fragment at a processing step subsequent to that depicted by FIG. 3.

Referring to FIG. 5, the second layer of resist 26 has been removed from the substrate. Then in at least one common deposition step, an insulative material 28 is deposited within both FLASH memory array isolation trenches 22 and FLASH peripheral circuitry isolation trenches 24. Such might occur by any existing or yet-to-be-developed process or processes. One specific example is high density plasma oxide deposition, and trench sidewall oxidation (not shown) either prior to or after such deposition. Preferably, such processing occurs by initially overfilling both sets of trenches, followed by a planarization step, for example chemical mechanical polishing.

Figure 6:
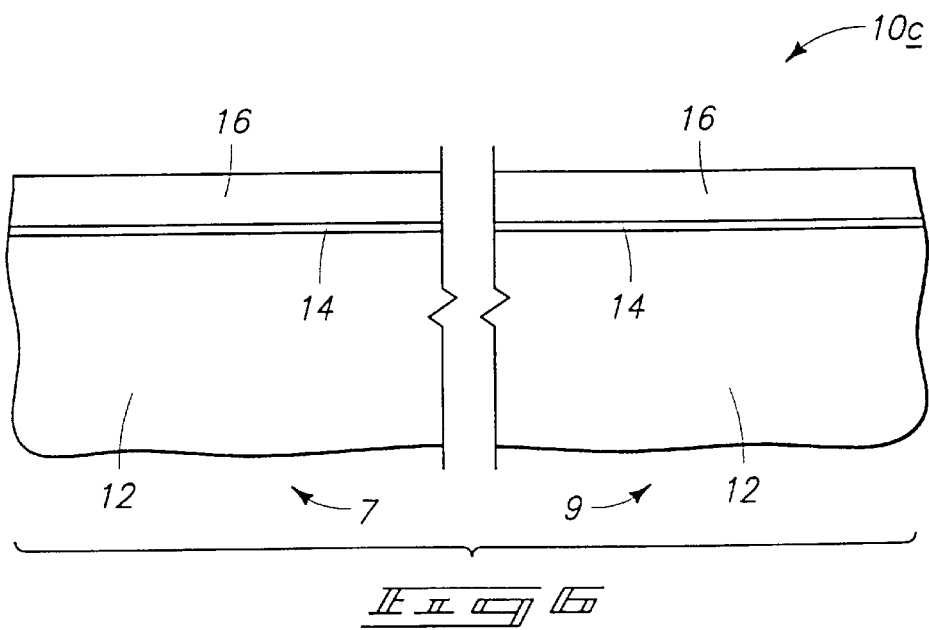
FIG. 6 is a diagrammatic sectional view of an alternate embodiment semiconductor wafer fragment at a processing step in accordance with an alternate aspect of the invention.

An alternate embodiment is next described to FIGS. 6–9. Like numerals from the first described embodiment are utilized where appropriate, with differences being indicated with suffix "c" or with different numerals. Wafer fragment 10c of FIG. 6 is the same as that of FIG. 1, but for lack of provision of oxide comprising layer 18.

Referring to FIG. 7, a first etching is conducted to produce a plurality of spaced isolation trenches into the semiconductor substrate within one of a FLASH memory array area and a FLASH peripheral circuitry area and not within the other. As shown, a photoresist layer 20c has been deposited and patterned to produce spaced isolation trench opening outlines 22 within FLASH memory array area 7, and etching of isolation trenches 22 into the underlying layers, while leaving periphery area 9 masked.

Referring to FIG. 8, resist layer 20c has been stripped and a subsequent resist layer 26c deposited and patterned to produce-spaced isolation trench outline openings 24 within FLASH peripheral circuitry area 9, while leaving isolation trenches 22 within FLASH memory array area 7 completely masked. Second etching is then conducting to extend openings 24 into substrate 10, essentially producing the FIG. 3 construction. As shown and preferred, the maximum depths of the peripheral isolation trenches 24 are again etched to a common selected depth and are deeper than the etch depth of trenches 22 within FLASH memory array area 7.

Referring to FIG. 9, resist layer 26c has been stripped, and a common deposition step conductive relative to both trenches 22 and 24 to fill such trenches.

This embodiment is not as preferred as the first described embodiment as two critically aligned masking steps are utilized to form the trenches, wherein only one critical mask is utilized in the FIG. 1 preferred embodiment. Preferably as shown, the shallower trenches are etched first to facilitate ease of their subsequent masking by resist filling for the second etch of the other trenches. Alternately and regardless, either the array or periphery trenches could be fabricated before the other. Such second embodiment processing illustrates but one example of forming outlines of the FLASH memory array isolation trenches and outlines of the FLASH peripheral circuitry isolation trenches using different masking steps, wherein only one masking step was utilized in the first described embodiment for defining all the trench outlines.

Further, by way of example only, another alternate embodiment is described with reference to FIGS. 10–13. Like numerals from the first described embodiment are utilized where appropriate, with differences being indicated by the suffix "d". FIG. 10 depicts the same essential construction of FIG. 7, whereby a plurality of spaced isolation trenches 22 are first etched into semiconductor substrate 10 within FLASH memory array area 7 and not within FLASH peripheral circuitry area 9. This could of course be reversed whereby peripheral patterning occurs before the array patterning.

Figure 11:
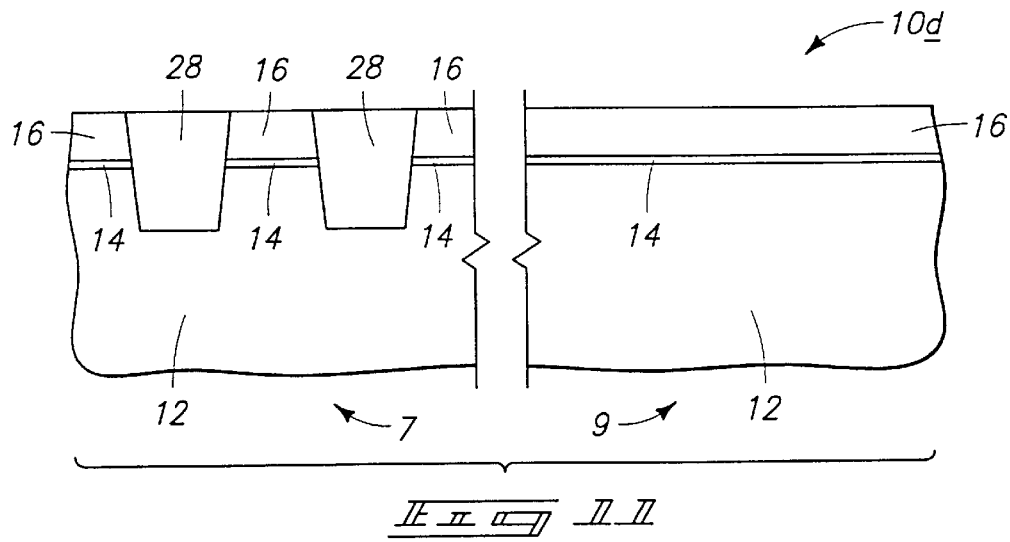
FIG. 11 is a view of the FIG. 10 wafer fragment at a processing step subsequent to that depicted by FIG. 10.

Referring to FIG. 11, resist layer 20d has been stripped and an insulative material deposition has been conducted to fill trenches 22 with an insulative material 28, such as those described in the preferred embodiments above.

Figure 12:
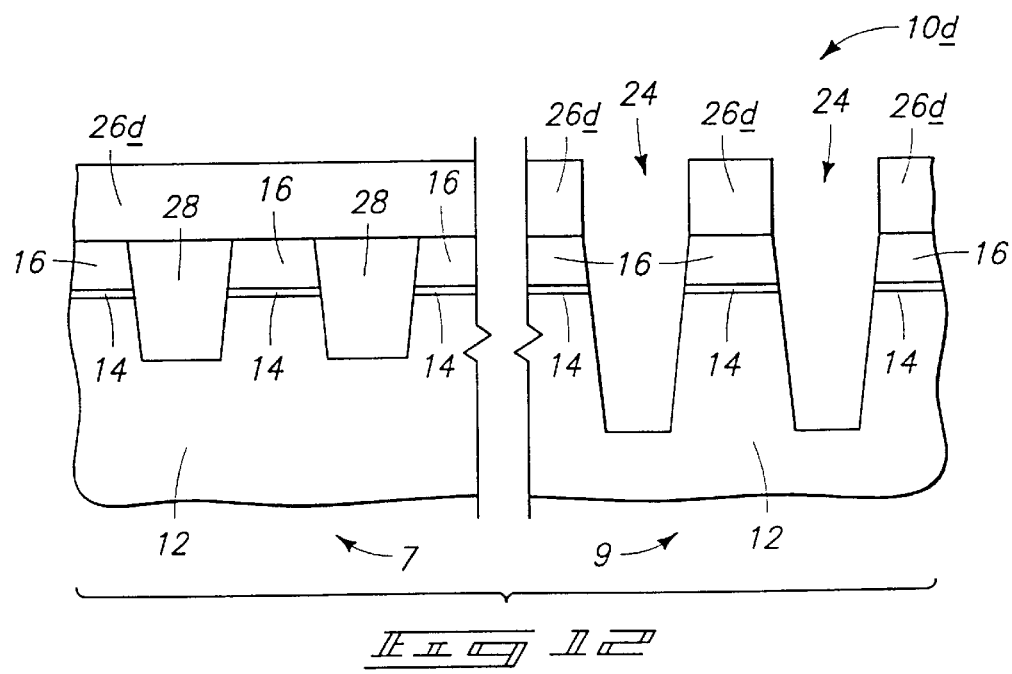
FIG. 12 is a view of the FIG. 10 wafer fragment at a processing step subsequent to that depicted by FIG. 11.

Referring to FIG. 12, resist layer 26d is deposited and patterned to form FLASH peripheral circuitry isolation trenches 24 therein, with subsequent etching being conducted to produce the subject isolation trenches 24 within substrate 12.

Figure 13:
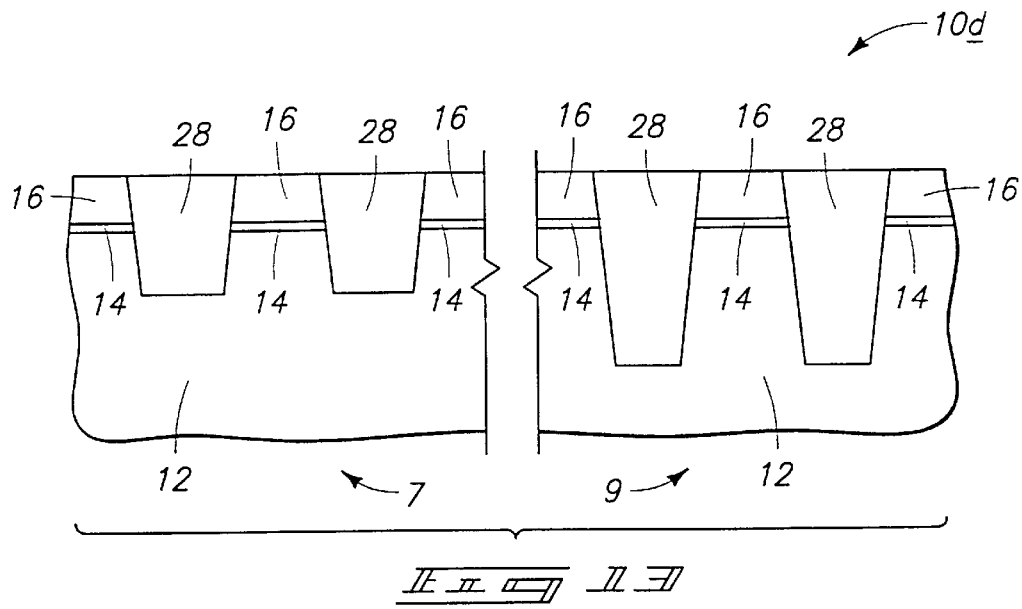
FIG. 13 is a view of the FIG. 10 wafer fragment at a processing step subsequent to that depicted by FIG. 12.

Referring to FIG. 13, resist layer 26d has been stripped, and trenches 24 filled with an insulative material 28, preferably the same as that described above. Planarizing then occurs to produce the FIG. 13 construction. The above lesser preferred "c" and "d" process flows could of course also be conducted in fabricating variable angled trenches, such as by way of example only that shown and described with respect to FIGS. 4 and 14.

Figure 15:
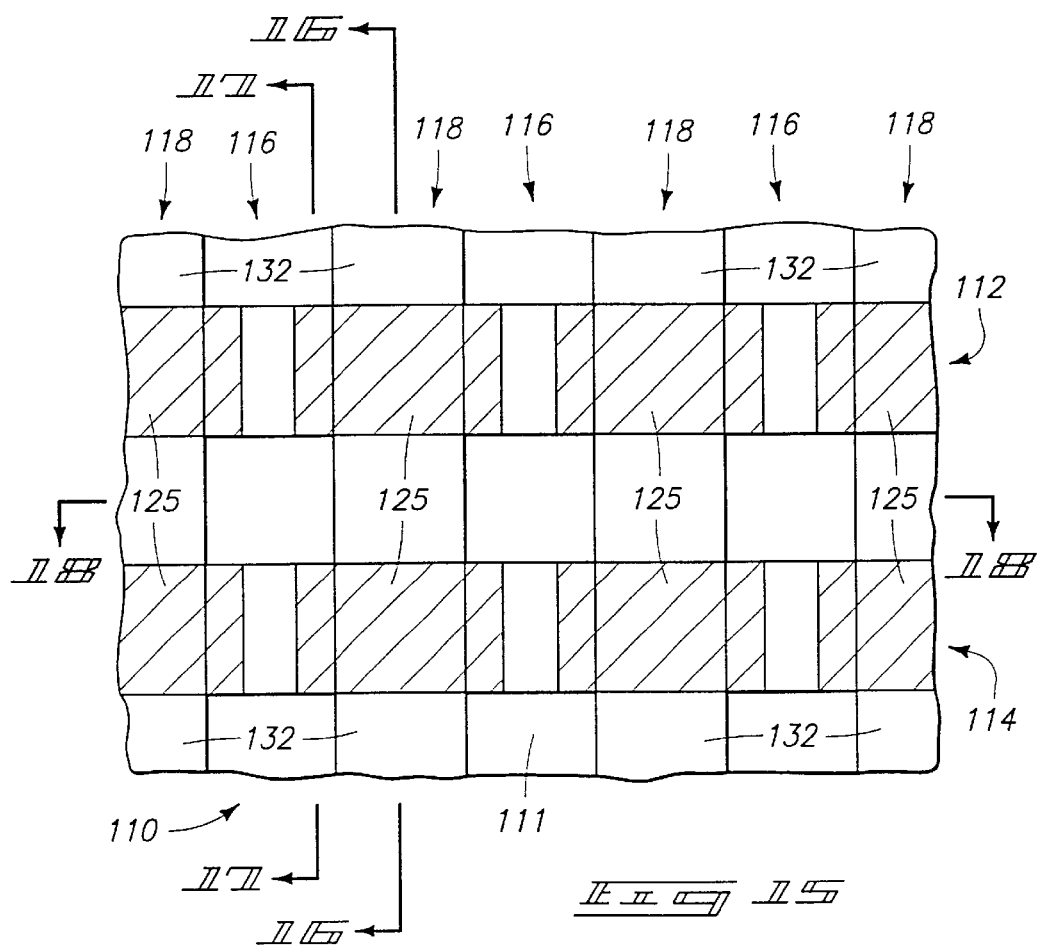
FIG. 15 is a top plan view of a semiconductor wafer fragment at a processing step in accordance with an aspect of the invention.

The description proceeds relative to array processing to produce exemplary FLASH memory circuitry. The invention contemplates article-of-manufacture subject matter germane or more pertinent to FLASH memory array transistors as opposed to FLASH peripheral circuitry construction, but for the peripheral trench isolation described above. Referring to FIGS. 15–18, a series of spaced trenches 116 are etched into semiconductor substrate substantially perpendicular to first floating gate word lines 112 and 114. Trenches 116 correspond to the various trenches 22 described above. The area 118 between the trenches thereby comprises spaced lines of active area relative to substrate 111 running between spaced trenches 116. The illustrated sectional cut 18—18 in FIG. 15 is taken adjacent and parallel with lines of floating gates 112 and 114, and will constitute source active area for the respective transistors formed along lines of floating gates 112 and 114. Accordingly, FIGS. 15–18 can also be considered as depicting, in a preferred embodiment, an alternating series of trenches and active area regions provided in substrate 111 in a line (i.e., line 18—18) running adjacent and along at least a portion of lines of floating gates 112 and 114. Active area regions 118 along that line, as depicted in FIG. 18, are thereby spaced or separated by trenches 116.

FIGS. 15–18 illustrate trenches 116 having been filled with an insulating dielectric material 120, such as high density plasma deposited silicon dioxide, and subjected to a planarization step to provide a substantially planar outer surface. At this point in the preferred process, such effectively forms an alternating series of trench isolation regions 122 and active area regions 118 in semiconductor substrate 111 running in a second line adjacent and along first lines of floating gates 112 and 114. The semiconductor wafer is typically and preferably fabricated to a point as would be depicted in FIG. 18, with the lines of floating gates being fabricated thereafter. The series of active areas 118 in the FIG. 18 depiction constitute or define discrete transistor source areas which are separated by isolation regions 122.

Figure 16:
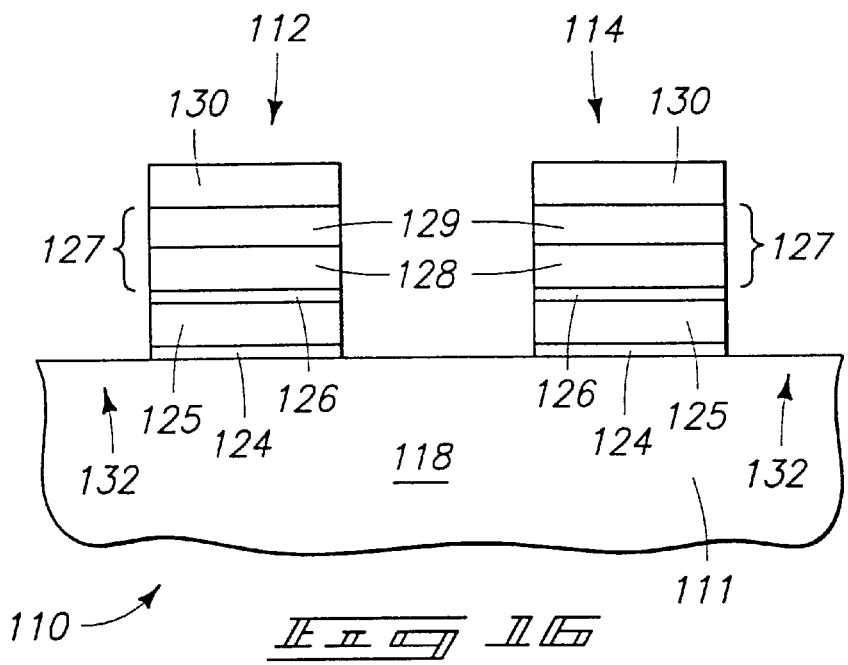
FIG. 16 is a sectional view taken through line 16—16 in FIG. 15.
Figure 17:
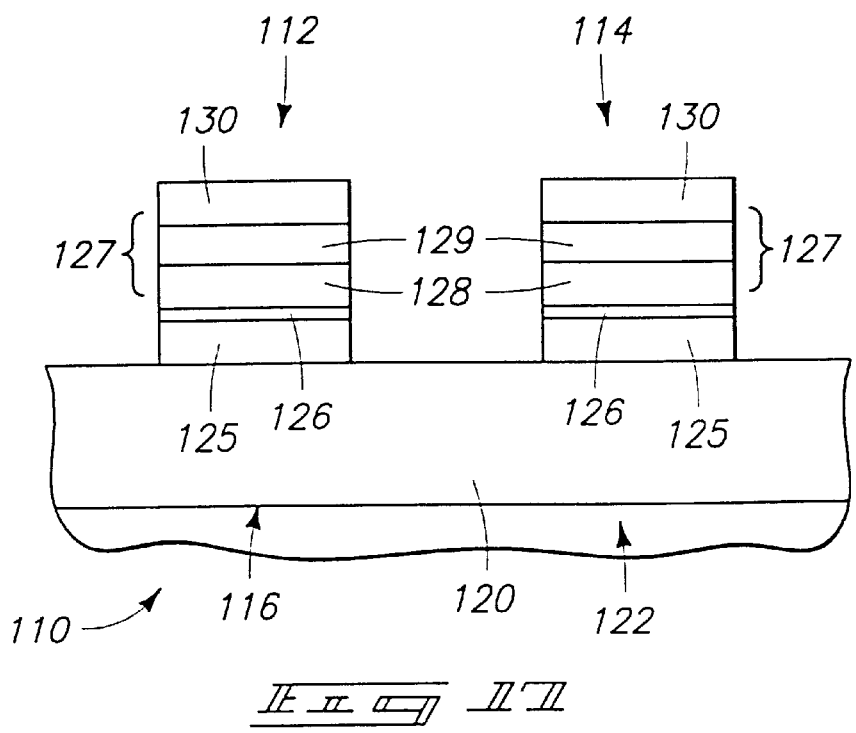
FIG. 17 is a sectional view taken through line 17—17 in FIG. 15.

Referring to FIGS. 16 and 17, lines of floating gates 112 and 114 preferably constitute a gate dielectric layer 124 typically comprising silicon dioxide, floating gate regions 125 typically comprising conductively doped polysilicon, an interpoly dielectric layer 126 typically comprising an oxide-nitride-oxide composite, a conductive line extending portion 127 comprising a conductively doped polysilicon layer 128 and a conductive silicide layer 129, and an insulative cap 130 (i.e., typically nitride or oxide). Example preferred spacing between lines 112 and 114 is 0.2 micron.

Drain and source implants in FLASH circuitry fabrication are typically separately conducted and optimized. Either the source regions or the drain regions can be fabricated before the other, preferably the source regions being patterned first.

Regardless for drain fabrication, a photoresist layer is ideally deposited and patterned to mask the floating gate word lines and source areas therebetween, and to leave the drain areas and isolation regions therebetween outwardly exposed. Exemplary drain areas 132 (FIGS. 15–16) are accordingly left outwardly exposed within active area regions 118. One or more suitable implants (not shown) are then provided to provide the desired depth and concentration of conductivity enhancing impurity to form the desired transistor drains within active areas 118 at locations 132. Alternately and by way of example only, one or more blanket implants can be conducted without using a photoresist layer to fabricate the drains. Such effectively forms a line of drains along one side of the respective lines of floating gates which are separated by trench isolation regions.

For source region fabrication for the respective floating gate transistors, the source line being formed in the depicted embodiment will comprise a line of source area for both lines of floating gates 112 and 114. Referring to FIG. 19, a masking layer 136 is formed over floating gate lines 112 and 114, floating gates 125, regions 122 and active areas 118. Layer 136 preferably comprises photoresist, although any layer or layers capable of functioning as a mask are contemplated. An example thickness for layer 136 is from about 8000 Angstroms to about 12,000 Angstroms. A third line mask opening 138 is formed within masking layer 136 over at least a portion of line 20—20 (FIG. 19). Accordingly, drain areas 132 (FIG. 1) remain effectively covered by masking layer 136. Accordingly in the depicted FIG. 19 preferred embodiment, masking layer 136 is patterned to cover ideally all but the illustrated area comprising both active area and trench isolation regions running in a line between lines of floating gates 112 an 114.

Figure 20:
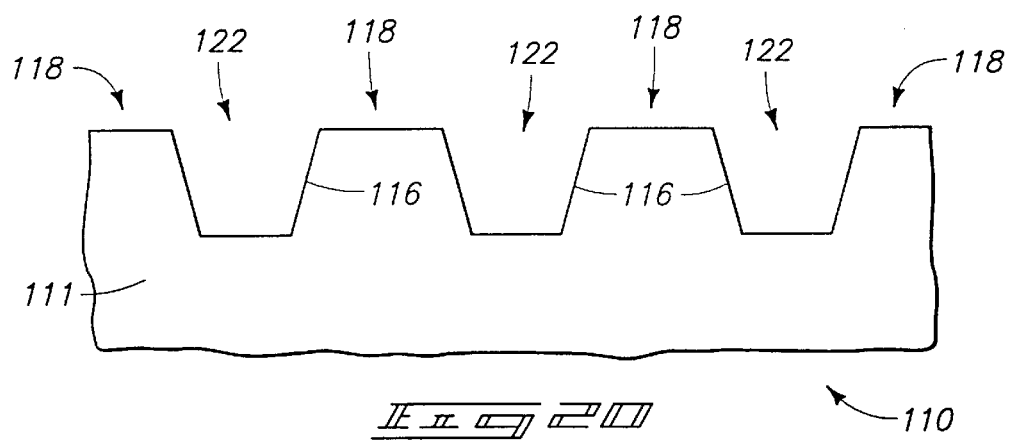
FIG. 20 is a sectional view taken through line 20—20 in FIG. 19.

Referring to FIG. 20, $SiO_2$ comprising isolation regions 122 ultimately exposed through third line mask opening 138 are substantially anisotropically etched substantially selectively relative to crystalline silicon exposed active area regions 118 through third line mask opening 138. Example preferred etching is disclosed in our U.S. patent application Ser. No. 09/516,818, filed Mar. 1, 2000, now U.S. Pat. No. 6.337.244. entitled "Method Of Forming FLASH Memor", naming Kirk D. Prall and Guy T. Blalock as inventors. This application is incorporated by reference.

Figure 21:
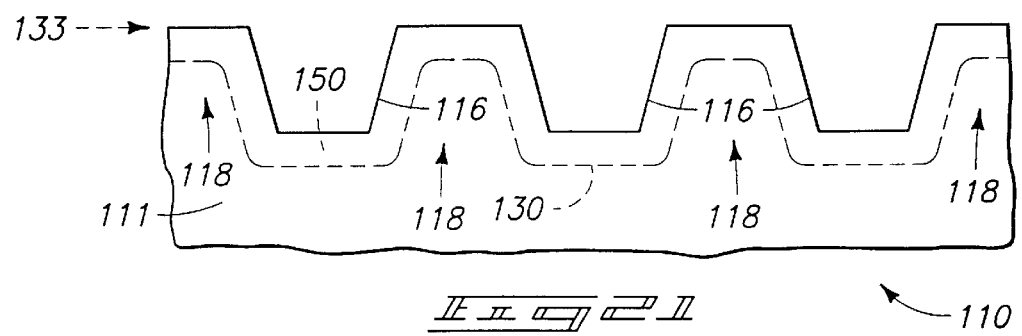
FIG. 21 is a view of the FIG. 20 wafer fragment at a processing step subsequent to that depicted by FIG. 20.

Referring to FIG. 21, preferred aspects of the invention further comprise implanting conductivity enhancing impurity through third line opening 138 into the crystalline silicon comprising semiconductor substrate beneath the trenches, along sidewalls of the trenches, and between the trenches, and forming therefrom a continuous line 150 of source active area within the crystalline silicon comprising semiconductor substrate along at least a portion of floating gate lines 112 and 114. Any existing or yet-to-be developed implementions for the implantings are, of course, possible. Example preferred implantings are disclosed in our U.S. patent application Ser. No. 09/260,182, filed Mar. 1,1999, entitled "Flash Memory and Method of Forming Flash Memory", naming Grahm Wolstenholme as inventor; and U.S. patent application Ser. No. 09/225,893, now U.S. Pat. No. 6.406.959. filed Jan. 4, 1999, entitled "Method Of Forming Flash Memory, Method of Forming Flash Memory And SRAM Circuitry, And Etching Methods", naming Kirk D. Prall, Gregg R. Rettschlag, and Graham Wolstenholme as inventors, both of which are hereby incorporated by reference as if included fully herein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. FLASH memory circuitry comprising:

a semiconductor substrate comprising a FLASH memory array area and comprising FLASH peripheral circuitry area having circuitry configured to at least read information from the FLASH memory array area;

a first line of floating gates comprising opposing sides received over the semiconductor substrate at least within the FLASH memory array area;

an alternating series of trench isolation regions and active area regions in the semiconductor substrate within the FLASH memory array area formed in a second line along one side of at least a portion of the first line of floating gates, the series of second line active area regions being conductively doped with a conductivity enhancing impurity and separated by the first line trench isolation regions along the second line, the second line trench isolation regions having a first maximum depth within the semiconductor substrate;

a series of spaced trenches within the semiconductor substrate within the FLASH memory array area formed in a third line along the other side of at least a portion of the first line of floating gates, the third line spaced trenches and semiconductor substrate material therebetween being conductively doped with a conductivity enhancing impurity along at least a portion of the third line to form a continuous line of source active area within the semiconductor substrate along at least a portion of the first line of floating gates along the other side, the third line trenches having a second maximum depth within the semiconductor substrate; and a series of spaced trench isolation regions formed in the semiconductor substrate within the FLASH peripheral circuitry area, at least some of the FLASH peripheral circuitry area spaced trench isolation regions having maximum depths which are greater than the first and second maximum depths.

2. The FLASH memory circuitry of claim 1 wherein the first and second maximum depths are the same.

3. The FLASH memory circuitry of claim 1 wherein all of the FLASH peripheral circuitry area spaced trench isolation regions have maximum depths which are greater than the first and second maximum depths.

4. The FLASH memory circuitry of claim 1 wherein, the first and second maximum depths are the same; and all of the FLASH peripheral circuitry area spaced trench isolation regions have maximum depths which are greater than the first and second maximum depths.

5. FLASH memory circuitry comprising:

a semiconductor substrate comprising a FLASH memory array area and comprising FLASH peripheral circuitry area having circuitry configured to at least read information from the FLASH memory array area;

a first line of floating gates comprising opposing sides received over the semiconductor substrate at least within the FLASH memory array area;

an alternating series of trench isolation regions and active area regions in the semiconductor substrate within the FLASH memory array area formed in a second line along one side of at least a portion of the first line of floating gates, the series of second line active area regions being conductively doped with a conductivity enhancing impurity and separated by the first line trench isolation regions along the second line, the second line trench isolation regions having a first maximum depth within the semiconductor substrate;

a series of spaced trenches within the semiconductor substrate within the FLASH memory array area formed in a third line along the other side of at least a portion of the first line of floating gates, the third line spaced trenches and semiconductor substrate material therebetween being conductively doped with a conductivity enhancing impurity along at least a portion of the third line to form a continuous line of source active area within the semiconductor substrate along at least a portion of the first line of floating gates along the other side, the third line trenches having a second maximum depth within the semiconductor substrate; and a series of spaced trench isolation regions formed in the semiconductor substrate within the FLASH peripheral circuitry area, at least some of the FLASH peripheral circuitry area spaced trench isolation regions having maximum depths which are different from the first and second maximum depths.

6. The FLASH memory circuitry of claim 5 wherein the first and second maximum depths are the same.

* * * * *

UNITED STATES PATENT AND TRADEMARK OFFICE
CERTIFICATE OF CORRECTION

PATENT NO. : 6,674,145 B2
DATED : January 6, 2004
INVENTOR(S) : Hurley et al.

It is certified that error appears in the above-identified patent and that said Letters Patent is hereby corrected as shown below:

Title page,
Item [57], ABSTRACT,
Line 6, please delete "," after "FLASH".

Column 3,
Line 16, please delete ":" after "one".

Column 5,
Line 15, please insert -- is -- after "16".
Line 41, please delete "degrees" after "15°".
Line 50, please delete ";" after "maximum".

Column 7,
Line 60, please delete "conducting" after "then" and insert -- conducted --.

Column 9,
Line 33, please delete "an" after "112" and insert -- and --.
Line 41, please delete "6.337.244" before "entitled" and insert -- 6,337,244 --.
Line 41, please delete "Memor" after "FLASH" and insert -- Memory --.
Line 59, please delete "6.406.959" after "No." and insert -- 6,406,959 --.

Signed and Sealed this

Seventh Day of September, 2004

JON W. DUDAS
*Director of the United States Patent and Trademark Office*